(12) United States Patent
Kwon et al.

(10) Patent No.: US 12,740,371 B2
(45) Date of Patent: Sep. 15, 2026

(54) WAFER CHUCK APPARATUS WITH AIR MEMBER AND METHOD OF FABRICATING A SEMICONDUCTOR DEVICE USING THE SAME

(71) Applicant: Samsung Electronics Co., Ltd., Suwon-si (KR)

(72) Inventors: Dong Hoon Kwon, Suwon-si (KR); Ju Hyun Lee, Suwon-si (KR); Bo Un Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 571 days.

(21) Appl. No.: 18/202,892

(22) Filed: May 27, 2023

(65) Prior Publication Data

US 2024/0063044 A1 Feb. 22, 2024

(30) Foreign Application Priority Data

Aug. 22, 2022 (KR) ........................ 10-2022-0104803

(51) Int. Cl.
*H10P 72/78* (2026.01)
*H10P 72/50* (2026.01)
*H10P 72/76* (2026.01)

(52) U.S. Cl.
CPC .......... *H10P 72/50* (2026.01); *H10P 72/7616* (2026.01); *H10P 72/7624* (2026.01); *H10P 72/78* (2026.01)

(58) Field of Classification Search
CPC ......... H01L 21/68785; H01L 21/68764; H01L 21/6838; H01L 21/68757
See application file for complete search history.

(56) References Cited

U.S. PATENT DOCUMENTS 6,727,583 B2 4/2004 Naka et al.
11,311,975 B2 4/2022 Yamanaka
2017/0154804 A1* 6/2017 Angelov ............. H01L 21/3065
(Continued)

FOREIGN PATENT DOCUMENTS

JP 2005039123 A 2/2005
JP 2009022920 A1 2/2009
(Continued)

OTHER PUBLICATIONS

English translation of JP 2005036123 (Year: 2005).*
English translation of KR 19980071438 (Year: 1998).*

*Primary Examiner* — Alan Snyder
(74) *Attorney, Agent, or Firm* — Muir Patent Law, PLLC

(57) ABSTRACT

A method of fabricating a semiconductor device comprises mounting a carrier substrate and a wafer on a wafer chuck of a wafer chuck apparatus, the carrier substrate and the wafer attached to each other, injecting air into an air member by selectively controlling at least one air injection pipe connected to the air member of the wafer chuck apparatus, tilting the wafer chuck to a predetermined angle in response to the air being injected into the air member, processing the wafer while the wafer chuck is tilted, determining whether to change a tilt angle of the wafer chuck or a position of the wafer, adjusting an amount of air injected into the air member according to a changed tilt angle of the wafer chuck or a changed position of the wafer, and processing the wafer after adjusting of the amount of air in the air member.

12 Claims, 22 Drawing Sheets

(56) References Cited

U.S. PATENT DOCUMENTS

| | | | | |
|---|---|---|---|---|
| 2021/0101252 | A1 | 4/2021 | Kurokawa et al. | |
| 2021/0237225 | A1 | 8/2021 | Sudo | |
| 2022/0139755 | A1 * | 5/2022 | Takada | H01L 21/68778 414/752.1 |

FOREIGN PATENT DOCUMENTS

| | | | | | |
|---|---|---|---|---|---|
| JP | 2016071009 | A | | 5/2016 | |
| JP | 2016107389 | A | | 6/2016 | |
| JP | 2018069411 | A | | 5/2018 | |
| JP | 2020055080 | A | | 4/2020 | |
| KR | 19980071438 | A | * | 10/1998 | H02N 13/00 |
| KR | 19990070626 | A | | 9/1999 | |
| KR | 1020200052929 | A | | 5/2020 | |

* cited by examiner

WAFER CHUCK APPARATUS WITH AIR MEMBER AND METHOD OF FABRICATING A SEMICONDUCTOR DEVICE USING THE SAME

CROSS-REFERENCE TO RELATED APPLICATION

This application claims priority to Korean Patent Application No. 10-2022-0104803 filed on Aug. 22, 2022, in the Korean Intellectual Property Office, and all the benefits accruing therefrom under 35 U.S.C. 119, the contents of which in its entirety are herein incorporated by reference.

BACKGROUND

1. Technical Field

The present disclosure relates to a wafer chuck apparatus with an air unit and a method of fabricating a semiconductor device using the same.

2. Description of the Related Art

A wafer is used to manufacture a semiconductor device through various semiconductor processes. A wafer chuck apparatus fixes/holds the wafer in place to prevent the wafer from being moved from an intended position during each step of semiconductor processes/procedures.

Wafer chuck apparatuses are classified into mechanical wafer chuck apparatuses, electrostatic wafer chuck apparatuses, and vacuum wafer chuck apparatuses. The mechanical wafer chuck apparatus fixes a wafer in place by pressing the surface of the wafer with a clamp, and the electrostatic wafer chuck apparatus fixes and separates a wafer by means of a voltage difference between the wafer and the wafer chuck apparatus. The vacuum wafer chuck apparatus holds a wafer by means of a vacuum suction force.

A semiconductor process using the wafer chuck apparatus may include a back grinding or back lap process of removing a back side of a wafer using, for example, a grinder.

This process conventionally uses a method of rotating a wafer and a grinding wheel with a rotation shaft of a grinder fixed or a method of improving a thickness variation of a wafer by adjusting a rotation shaft of a wafer chuck to control the contact angle between a grinding wheel and the wafer.

However, the former cannot control the thickness of a wafer, and even in the latter method, a rotation axis of a structure including the wafer chuck positioned below the wafer is tilted and thus the load is large and the fine adjustment capability is poor due to the movement of the heavy load.

SUMMARY

Aspects of the present disclosure provide a wafer chuck apparatus which performs a process by easily titling a wafer using an air member.

Aspects of the present disclosure also provide a method of fabricating a semiconductor device which performs a process by easily titling a wafer using an air member.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a method of fabricating a semiconductor device, comprising mounting a carrier substrate and a wafer on a wafer chuck of a wafer chuck apparatus, the carrier substrate and the wafer attached to each other, injecting air into an air member by selectively controlling at least one air injection pipe connected to the air member of the wafer chuck apparatus, tilting the wafer chuck to a predetermined angle in response to the air being injected into the air member, processing the wafer while the wafer chuck is tilted, determining whether to change a tilt angle of the wafer chuck or a position of the wafer, adjusting an amount of air injected into the air member according to a changed tilt angle of the wafer chuck or a changed position of the wafer and maintaining, and processing the wafer after adjusting of the amount of air in the air member.

According to another aspect of the present disclosure, there is provided a wafer chuck apparatus comprising a support portion made of a metal and having a circular upper surface, a wafer chuck in a disk shape positioned on the support portion and having a plurality of vacuum channels therein, an air member disposed between the support portion and the wafer chuck and connected to an external air pump, a hinge connected to the plurality of vacuum channels at a center of a lower portion of the wafer chuck and connected to a vacuum pump through a vacuum suction pipe and a controller connected to the vacuum pump, the air pump, and the vacuum suction pipe and configured to control the same.

According to another aspect of the present disclosure, there is provided a wafer chuck apparatus comprising a support portion made of a metal and having a circular upper surface, a wafer chuck in a disk shape positioned on the support portion and having a plurality of vacuum channels therein, an air member disposed between the support portion and the wafer chuck and connected to an external air pump, a hinge connected to the plurality of vacuum channels at a center of a lower portion of the wafer chuck and connected to an external vacuum pump through a vacuum suction pipe and a controller connected to the vacuum pump, the air pump, and the vacuum suction pipe and configured to control the same, wherein the air member comprises a base provided on the upper surface of the support portion, an outer air holder connecting an edge of the base with an edge of the wafer chuck and at least one inner air holder disposed around a central through hole surrounding the vacuum suction pipe on an upper surface of the base in a circumferential direction and connecting the upper surface of the base with a lower surface of the wafer chuck, the outer air holder is provided in a shape of a circular pleated tube having a plurality of pleats, which connects the edge of the base with the edge of the wafer chuck, and the inner air holder is provided in a shape of a circular pleated tube having a plurality of pleats.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which:

FIGS. 6 to 11 are views illustrating examples of various shapes of an air member constituting the wafer chuck apparatus according to the second embodiment of the present disclosure;

DETAILED DESCRIPTION OF THE EMBODIMENTS

Figure 1:
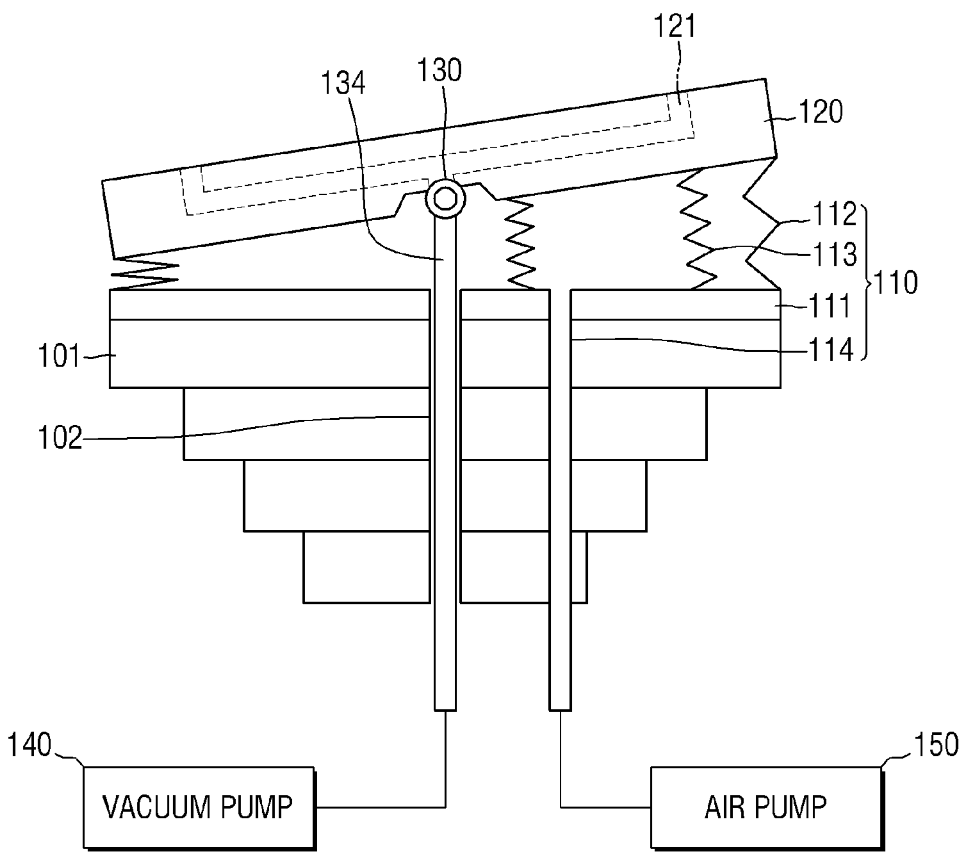
FIG. 1 is a cross-sectional view of a wafer chuck apparatus according to a first embodiment of the present disclosure.

Various objects, advantages and features of the invention will become apparent from the following description of preferred embodiments with reference to the accompanying drawings. In the specification, in adding reference numerals to components throughout the drawings, it is to be noted that like reference numerals designate like components even though components are shown in different drawings. Further, terms used in the specification, “first”, “second”, etc., can be used to describe various components, but the components are not to be construed as being limited to the terms. The terms are only used to differentiate one component from other components. Further, when it is determined that the detailed description of the known art related to the present invention may obscure the gist of the present invention, the detailed description thereof will be omitted.

Figure 2:
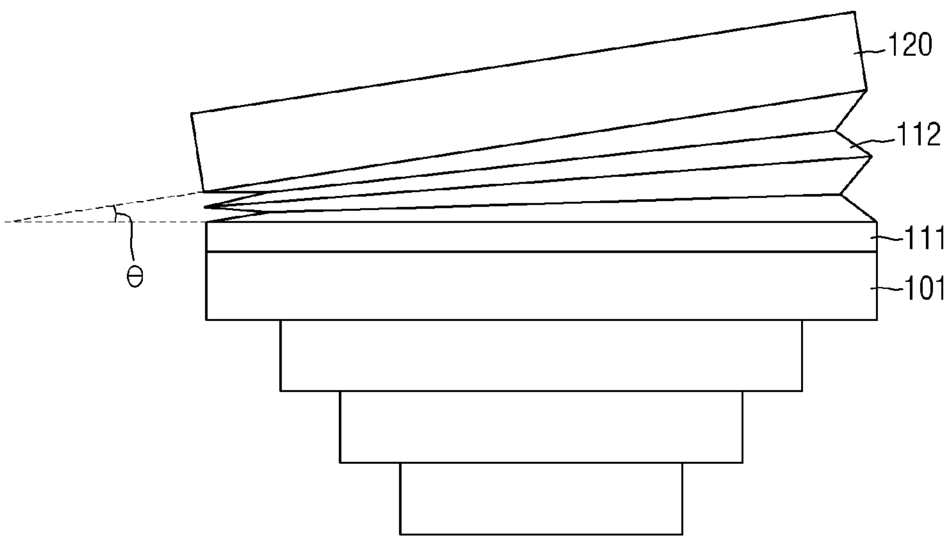
FIG. 2 is a side view of the wafer chuck apparatus according to the first embodiment of the present disclosure.
Figure 3:
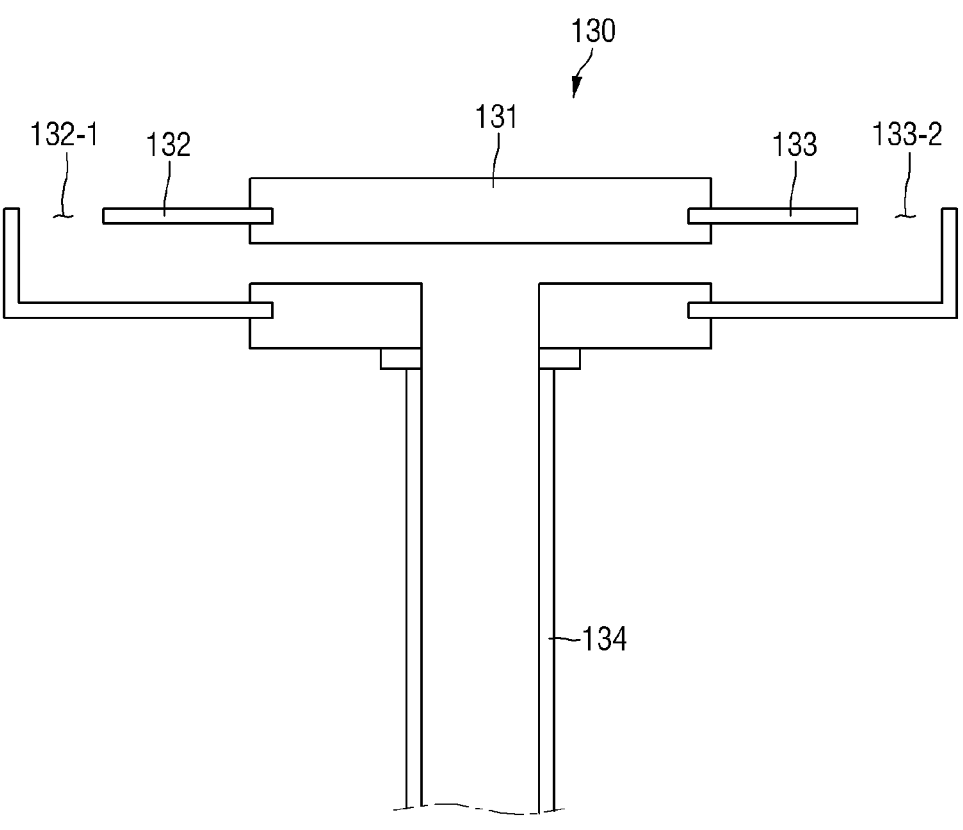
FIG. 3 is a cross-sectional view of a hinge connection constituting the wafer chuck apparatus according to the first embodiment of the present disclosure.
Figure 4:
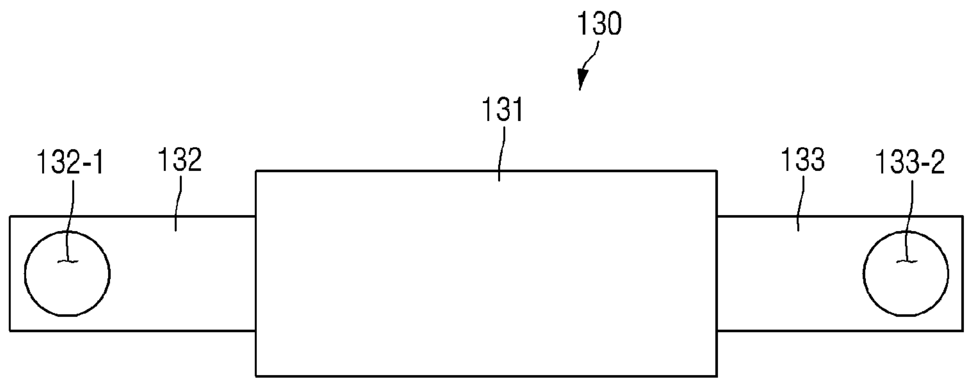
FIG. 4 is a top view of the hinge connection of FIG. 3.

Hereinafter, embodiments of the present disclosure will be described with reference to the attached drawings. FIG. 1 is a cross-sectional view of a wafer chuck apparatus according to a first embodiment of the present disclosure, FIG. 2 is a side view of the wafer chuck apparatus according to the first embodiment of the present disclosure, FIG. 3 is a cross-sectional view of a hinge connection constituting the wafer chuck apparatus according to the first embodiment of the present disclosure, and FIG. 4 is a top view of the hinge connection of FIG. 3.

As shown in FIG. 1, the wafer chuck apparatus according to the first embodiment of the present disclosure includes a support portion 101, a disk-shaped wafer chuck 120, an air member 110, a hinge connection 130, and a controller (not shown). The support portion 101 is formed of a metallic material (e.g., a metal), has a disk-shaped upper surface (e.g., a circular upper surface), and is capable of rotating. The wafer chuck 120 is positioned on the support portion 101 and has a plurality of vacuum channels 121 therein. The air member is positioned between and connects the support portion 101 and the wafer chuck 120 and is connected to an external air pump 150. The support portion 101 may be a support maintaining/upholding the air member 110 from below. The hinge connection 130 is connected to the plurality of vacuum channels 121 at the center of a lower portion of the wafer chuck 120 and is connected to a vacuum pump 140 through a vacuum suction pipe 134. The controller is connected to the vacuum pump 140, the air pump 150, the vacuum suction pipe 134, and the like to control the same. Hinge connections 130 of embodiments of the present disclosure may be hinges having structures and functions described below. Air members 110 of embodiments of the present disclosure may be pneumatic devices utilizing gas/air pressure to move/control parts of a manufacturing device.

The air member 110 includes a base 111 provided on the upper surface of the support portion 101, an outer air portion 112 configured to connect the edge of the base 111 and the edge of the wafer chuck 120, and at least one inner air portion 113 configured to connect one upper side/surface of the base 111 to one side of a lower surface of the wafer chuck 120. An inner air portion 113 of the present disclosure may be an inner air bag or an inner air holder enclosing a gas or air in it together with one or more additional components and may be also called just as an inner portion of the air member 110. The outer air portion 112 may be an outer air bag or an outer air holder enclosing a gas or air in it together with one or more additional components, and may be also called an outer portion of the air member 110.

In this case, in the air member 110, the base 111, the outer air portion 112, and the inner air portion 113 may be provided separately or integrally.

The air member 110 may be made of a synthetic resin material, so that the base 111, the outer air portion 112, and the inner air portion 113 may be provided in the form of a membrane made of any one of, for example, a nylon-based resin, a polyester-based resin, a polyolefin-based resin, a Teflon-based resin, and an aramid-based resin. In this case, the air member 110 may be formed such that the modulus (e.g., Young’s modulus) of the synthetic resin material may have a value of, for example, 20 to 80 N/m2 for improved durability, and thus be prevented from damage even in repeated contraction and expansion.

Alternatively, the outer air portion 112 and the inner air portion 113 may be optionally formed of any one of synthetic resin fibers, such as nylon-based fibers, polyester-based fibers, polyolefin-based fibers, and aramid-based fibers.

Here, when the outer air portion 112 and the inner air portion 113 are formed of a synthetic resin fiber, the synthetic resin fiber may have a tensile strength of 70 kgf/inch or more, preferably, 175 kgf/inch or more, as measured by American Society for Testing and Materials Standards (ASTM) D 5034. In addition, the synthetic resin fabric may have a tensile elongation of 17% to 65%, preferably 18% to 62%, as measured at room temperature by ASTM D 5034. Here, the tensile elongation is preferably 17% or more in terms of properties and it is preferable that the tensile elongation does not exceed 65% in terms of resistance.

For example, the outer air portion 112 is provided in the form of a circular pleated tube having a plurality of pleats, which connects the edge of the base 111 with the edge of the wafer chuck 120 as shown in FIGS. 1 and 2. For example, the outer air portion 112 may extend from an edge (e.g., an edge of an upper surface) of the base 111 to an edge (e.g., an edge of a lower surface) of the wafer chuck 120. The outer air portion 112 may have a multi-layer structure of a predetermined thickness of a synthetic resin membrane or fiber, and may have at least one through hole (not shown) on one side surface to facilitate the flow of air to and from the outside. While the outer air portion 112 is vertically contracting or expanding, air smoothly flows to and from the outside through the through-hole, facilitating the contracting and expanding operations. When the outer air portion 112 is provided in the form of a Teflon-based resin fiber or a microporous membrane having billions of holes per 1 square meter, it is not necessary to provide a through-hole on one side surface of the outer air portion 112.

As the outer air portion 112 is in the form of a circular pleated tube or a cylindrical pleated tube having a circular shape in a plan view, the outer air portion 112 may smoothly contract and expand in the vertical direction by the operation of the wafer chuck 120. In this case, the outer air portion 112 may be tilted at a predetermined angle θ by the inner air portion 113, as shown in FIG. 2.

The inner air portion 113 may be provided in the form of a circular pleated tube or a cylindrical pleated tube having a circular shape in a plan view having a plurality of pleats (e.g., on side surfaces/walls of the pleated tube), which connects one upper side of the base 111 with one side of the lower surface of the wafer chuck 120. For example, the pleated tube may extend from an upper surface of the base 111 to the lower surface of the wafer chuck 120. The inner air portion 113 is connected to the external air pump 150 through an air injection pipe 114 passing through the base 111 and the support portion 101.

The inner air portion 113 may be provided in the form of a synthetic resin membrane or fiber made of any one of, for example, a nylon-based resin, a polyester-based resin, a polyolefin-based resin, a Teflon-based resin, and an aramid-based resin. Under the control of the controller, air is injected from the air pump 150 into the inner air portion 113, so that the inner air portion 113 contracts or expands in the vertical direction to tilt the wafer chuck 120 to a predetermined angle θ.

The wafer chuck 120 is of a disk shape, has a plurality of vacuum channels 121 provided therein and adapted to draw a wafer onto the wafer chuck 120 by means of a vacuum suction force, and holds the wafer by vacuum through vacuum holes of the upper surface connected to each of the vacuum channels 121. As shown in FIG. 1, a central part of the wafer chuck 120 may be formed to have inclined surfaces at both opposite ends around a connection part of the hinge connection 130 to accommodate the tilted angle when the wafer chuck 120 is tilted.

The hinge connection 130 is provided at the center of a lower portion of the wafer chuck 120, has an upper portion connected to the plurality of vacuum channels 121, and is connected to the vacuum pump 140 through the vacuum suction pipe 134 below the hinge connection 130.

As shown in FIGS. 3 and 4, the hinge connection 130 includes a cylindrical-shaped rotation portion 131 which is partially inserted into the center of the lower portion of the wafer chuck 120 and is connected to the vacuum suction pipe 134 at the lower portion thereof, and a first vacuum channel pipe 132 and a second vacuum channel pipe 133 that are respectively connected to or contact opposite ends of the rotating portion 131 and connected to the plurality of vacuum channels 121.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The rotating portion 131 has a cylindrical shape having a hole extending in a long axis direction (e.g., in a longitudinal/lengthwise direction), is partially inserted into the center of the lower portion of the wafer chuck 120, and is connected to the vacuum suction pipe 134 penetrating through a lower portion thereof. The rotating portion 131 is provided rotatably about the long axis as shown in FIG. 4.

The first vacuum channel pipe 132 and the second vacuum channel pipe 133 are connected at each end of the rotating portion 131 in the long axis direction to interlock to rotate, and is inserted into the lower portion of the wafer chuck 120. Here, as shown in FIG. 4, the first vacuum channel pipe 132 includes a first connection through hole 132-1 at an upper end to be connected to one of the plurality of vacuum channels 121 and the second vacuum channel pipe 133 includes a second connection through hole 133-2 at an upper end to be connected to one of the plurality of vacuum channels 121.

The hinge connection 130 configured as described above may use the first vacuum channel pipe 132 and the second vacuum channel pipe 133 to hold the wafer by vacuum through the plurality of the vacuum channels 121 using vacuum suction generated by the vacuum pump 140 and provided through the vacuum suction pipe 134.

At this time, when the wafer chuck 120 is tilted at a predetermined angle by the inner air portion 113, the vacuum suction pipe 134 is slightly raised and the rotating portion 131 of the hinge connection 130 rotates at the same time, which allows the wafer chuck 120 to be tilted.

As shown in FIG. 1, an upper portion of the vacuum suction pipe 134 penetrates and is coupled below the rotating portion 131 of the hinge connection 130, and the vacuum suction pipe 134 is provided within a central through hole 102 penetrating through the base 111 and the support portion 101 and may function as a vacuum suction passage while moving in the vertical direction (e.g., up and down) by the controller.

In the wafer chuck apparatus configured as described above according to the first embodiment of the present disclosure, when air is injected into the inner air portion 113 from the air pump 150 under the control of the controller, the inner air portion 113 expands in the vertical direction to tilt the wafer chuck 120 at a predetermined angle θ, and a semiconductor process, such as a grinding or back lap process, may be performed while the rotating portion 131 rotates. The air provided by the air pump 150 may be atmospheric air or a gas, e.g., a process gas. Semiconductor processes in the present disclosure may be semiconductor manufacturing processes.

Figure 5:
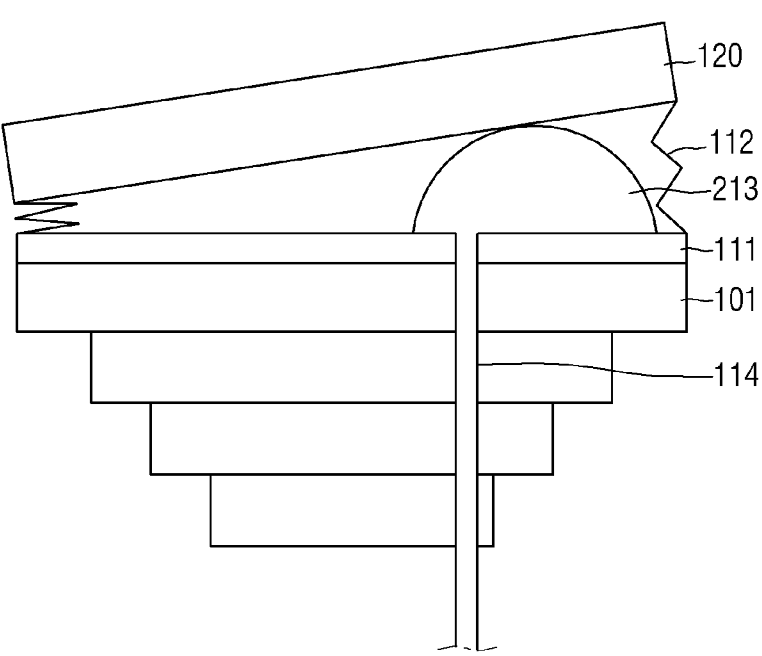
FIG. 5 is a cross-sectional view of a wafer chuck apparatus according to a second embodiment of the present disclosure.

Hereinafter, a wafer chuck apparatus according to a second embodiment of the present disclosure will be described with reference to FIGS. 5 to 11. FIG. 5 is a cross-sectional view of a wafer chuck apparatus according to a second embodiment of the present disclosure, and FIGS. 6 to 11 are views illustrating examples of various shapes of an air member constituting the wafer chuck apparatus according to the second embodiment of the present disclosure. A wafer chuck apparatus in the present disclosure may be a structure including a wafer chuck and related components to the wafer chuck, e.g., wafer chuck supporting structure and/or wafer chuck operating structure. For example, the wafer chuck apparatus may be a part of an apparatus for manufacturing a semiconductor device. For example, the apparatus for manufacturing a semiconductor device may comprise the wafer chuck apparatus and/or all components constituting the wafer chuck apparatus.

As shown in FIG. 5, the wafer chuck apparatus according to the second embodiment of the present disclosure is the same as the wafer chuck apparatus according to the first embodiment of the present disclosure described above, and differs from the first embodiment in that an inner air portion 213 constituting an air member has a hemisphere balloon shape, and semicircular balloon shape in a cross-sectional view. For example, the wafer chuck apparatus according to the second embodiment of the present disclosure may be the same as the wafer chuck apparatus of the first embodiment described above except that the inner air portion 213 constituting the air member has a hemisphere balloon shape. Accordingly, descriptions of the same configurations as those in the wafer chuck apparatus according to the first embodiment of the present disclosure will not be duplicated/provided here.

The inner air portion 213 may be formed in a semicircular balloon shape (e.g., in a cross-sectional view) using a synthetic resin membrane or fiber made of any one of, for example, a nylon-based resin, a polyester-based resin, a polyolefin-based resin, a Teflon-based resin, and an aramid-based resin. The inner air portion 213 may inflate like a balloon as air is injected thereto under the control of the controller.

As the inner air portion 213 inflates like a balloon, it may lift and tilt a wafer chuck 120 to a predetermined angle θ.

The inner air portion 213 according to the second embodiment of the present disclosure may be provided at various positions as shown in FIGS. 6 to 11.

Figure 6:
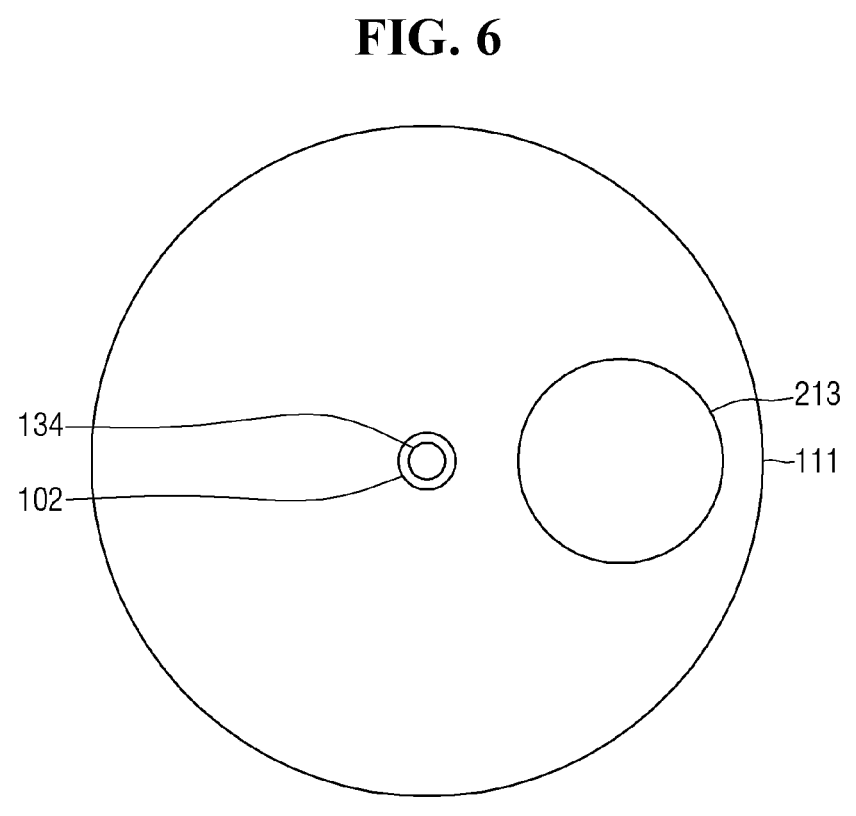

First, as shown in FIG. 6, the inner air portion 213 in a first shape may be located in a right half of an upper surface of the base 111 bisected into left and right halves around (e.g., with respect to) the central through hole 102 surrounding a suction pipe 134.

The inner air portion 213 in the first shape has a semicircular balloon shape (e.g., in a cross-sectional view) and is located on the right side with respect to the central through hole 102. The inner air portion 213 is connected to the air pump 150 through the air injection pipe 114 that penetrates the base 111 and the support portion 101.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Accordingly, under the control of the controller, air is injected into the inner air portion 213 in the first shape through the air injection pipe 114, so that the wafer chuck 120 may be tilted at a predetermined angle θ as shown in FIG. 5.

Figure 7:
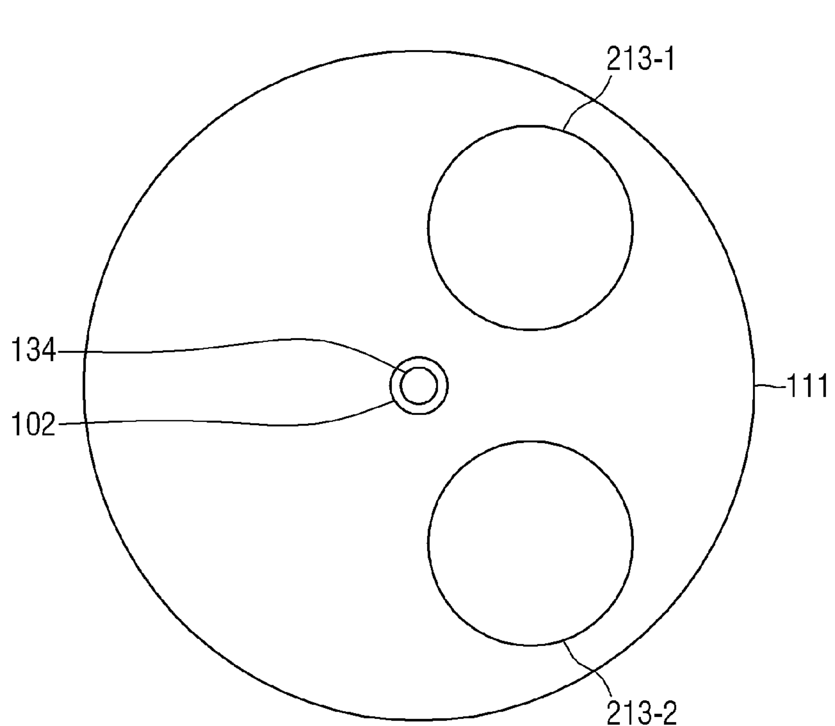

Alternatively, as shown in FIG. 7, two inner air portions in a second shape may be located in a right half of the upper surface of the base 111 bisected into left and right halves around (e.g. with respect to) the central through hole 102 surrounding the suction pipe 134.

The two inner air portions 213-1 and 213-2 in the second shape may have the same shape and the same area and may be equally located in the right half of the base 111. Each of the inner air portions 213-1 and 213-2 in the second shape may have a separate air injection pipe penetrating the base 111 and the support portion 101 and be connected to the external air pump 150.

Accordingly, air is equally injected into each of the two inner air portions 213-1 and 213-2 in the second shape through the separately connected air injection pipe, so that the wafer chuck 120 may be more stably tilted at a predetermined angle θ.

Figure 8:
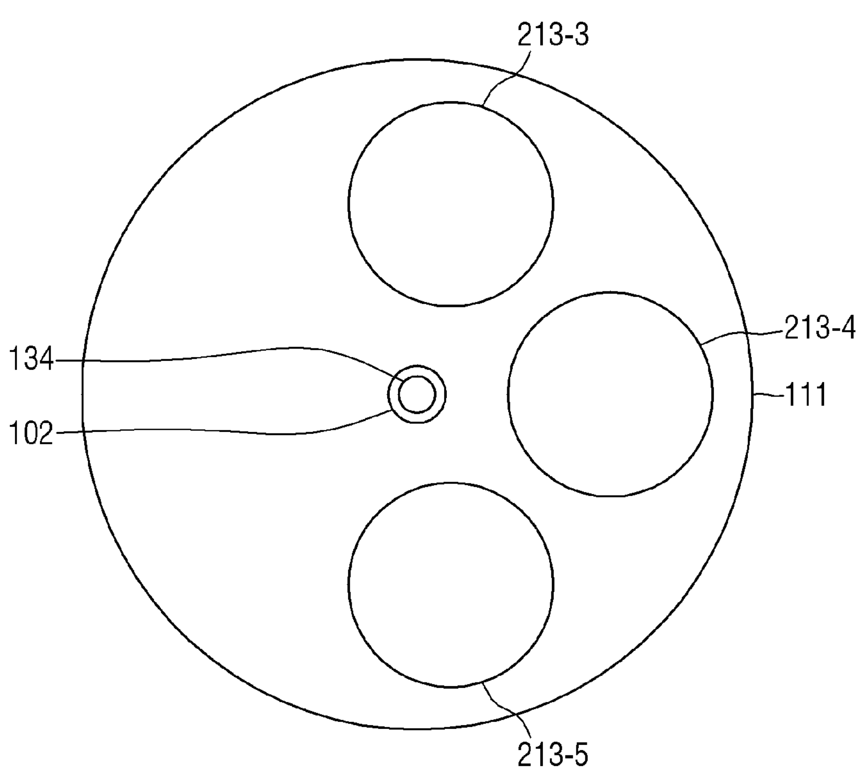

Alternatively, as shown in FIG. 8, three inner air portions in a third shape may be located at the right side on the upper surface of the base 111 divided into six equal sections around the central through hole 102 surrounding the suction pipe 134.

The three inner air portions (e.g., inner air bags/holders) 213-3, 213-4, and 213-5 in the third shape have the same shape and area as one another and may be equally located on the right side of the upper surface of the base 111. Each of the inner air portions 213-3, 213-4, and 213-5 in the third shape may have a separate air injection pipe penetrating the base 111 and the support portion 101 and be connected to the external air pump 150.

Accordingly, a different amount of air may be injected into each of the three inner air portions 213-3, 213-4, and 213-5 in the third shape through the separately connected air injection pipe, so that the wafer chuck 120 may be more stably tilted at a predetermined angle θ.

For example, the amount of air to be injected into the inner air portion 213-4 positioned in the middle among the three inner air portions 213-3, 213-4, and 213-5 in the third shape is set to be different from the amount of air to be injected into the other two inner air portions 213-1 and 213-5. The amount of air to be injected into the other two inner air portions 213-3 and 213-5 may be set to be 60% to 80% of the amount of air to be injected into the inner air portion 213-4 positioned in the middle.

Therefore, the three inner air portions 213-3, 213-4, and 213-5 in the third shape stably inflate to lift the wafer chuck 120, so that the wafer chuck 120 can tilt stably without tilting to an unintended direction.

Figure 9:
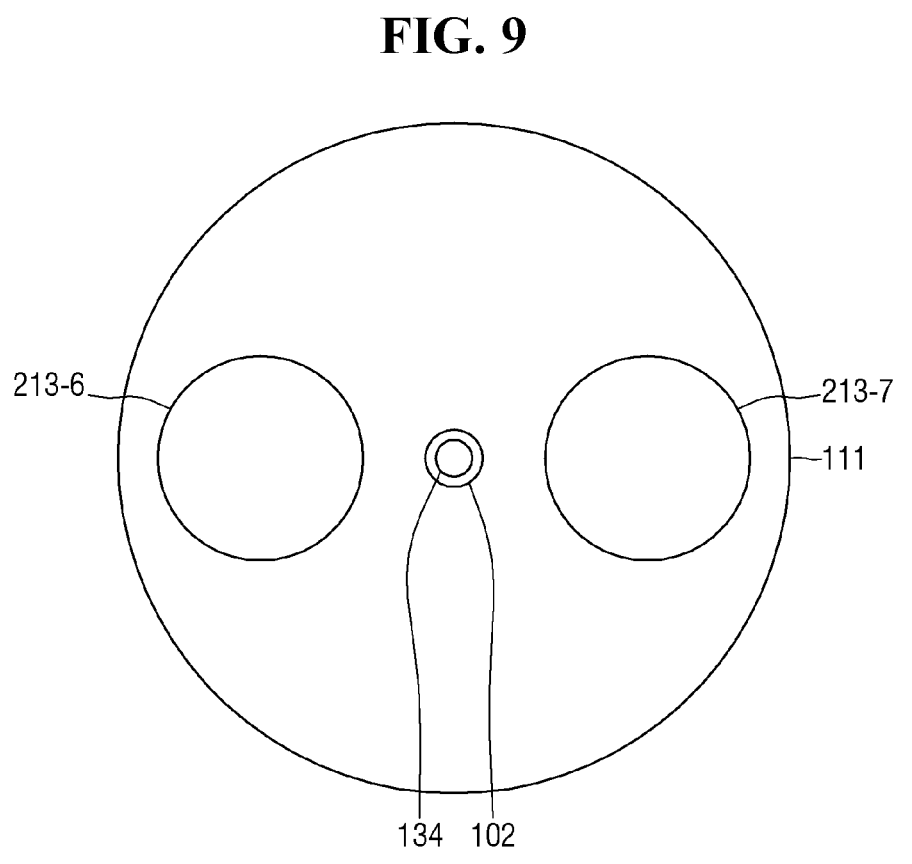

Alternatively, as shown in FIG. 9, two inner air portions in a fourth shape may be located one by one about the central through hole 102 surrounding the suction pipe 134 in regions obtained by bisecting the upper surface of the base 111 into left and right halves. For example, the two inner air portions (e.g., inner air holders/bags) may be disposed opposite sides with respect to the central through hole 102.

The two inner air portions 213-6 and 213-7 in the fourth shape may have the same shape and the same area and may be equally located in the left and right halves of the base 111. Each of the inner air portions 213-6 and 213-7 in the fourth shape may have a separate air injection pipe penetrating the base 111 and the support portion 101 and be connected to the external air pump 150.

Accordingly, air may be selectively injected into each of the inner air portions 213-6 and 213-7 in the fourth shape through the separately connected air injection pipe, so that the wafer chuck 120 can be tilted at a predetermined angle θ in either the left or right direction as selected.

Figure 10:
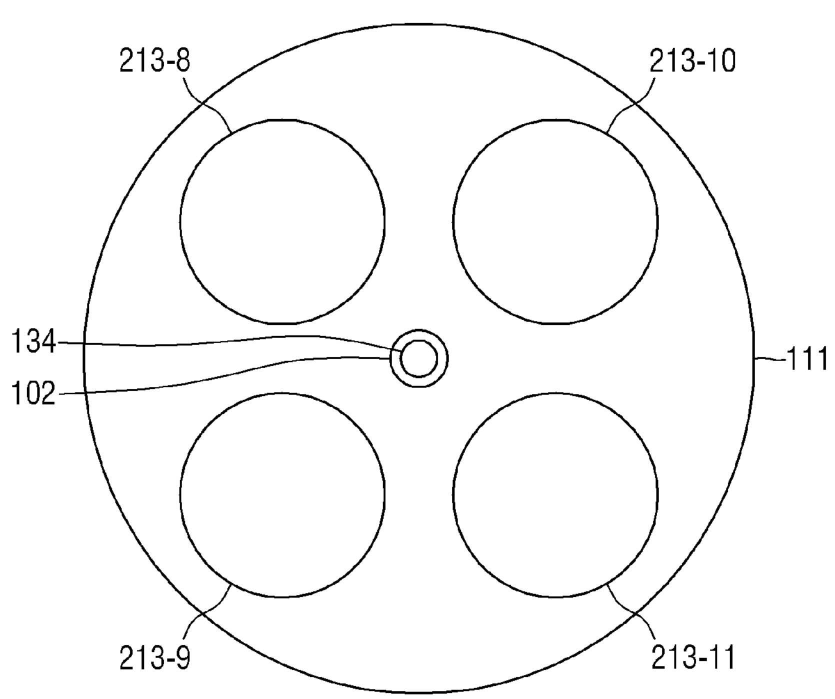

Alternatively, as shown in FIG. 10, inner air portions in a fifth shape may be located one by one (e.g., one in each region) about the central through hole 102 surrounding the suction pipe 134 in regions each obtained by dividing the upper surface of the base 111 into quarters.

These inner air portions 213-8, 213-9, 213-10, and 213-11 in the fifth shape may have the same shape and the same area and be equally located in the quartered regions along the arc of the upper surface of the base 111. Each of the inner air portions 213-8, 213-9, 213-10, and 213-11 in the fifth shape may have a separate air injection pipe penetrating the base 111 and the support portion 101 and be connected to the external air pump 150.

Accordingly, air is selectively injected into each of the inner air portions 213-8, 213-9, 213-10, and 213-11 in the fifth shape through the separately connected air injection pipe, so that the wafer chuck 120 can be more stably tilted to either the left or right at a predetermined angle θ.

For example, when the wafer chuck 120 is tilted to the left, air is equally injected into two inner air portions 213-10 and 213-11 located on the right side among the inner air portions 213-8, 213-9, 213-10, and 213-11 in the fifth shape, so that the wafer chuck 120 may be tilted at the predetermined angle θ.

On the other hand, when the wafer chuck 120 is tilted to the right, air is equally injected into two inner air portions 213-8 and 213-9 located on the left side among the inner air portions 213-8, 213-9, 213-10, and 213-11 in the fifth shape, so that the wafer chuck 120 may be tilted at the predetermined angle θ.

Figure 11:
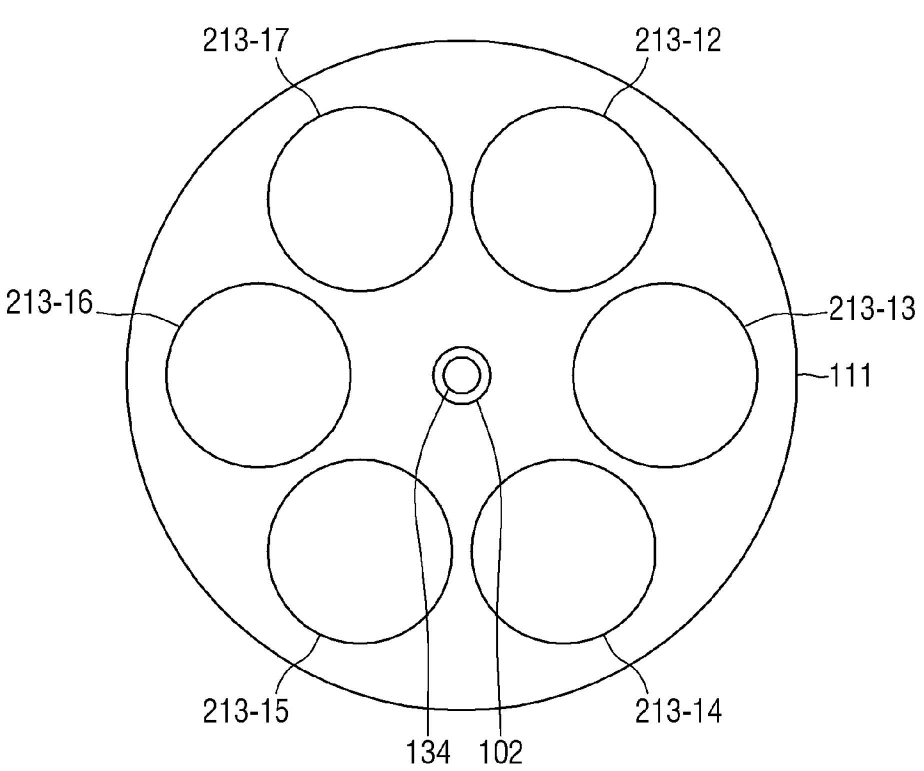

Alternatively, as shown in FIG. 11, inner air portions in a sixth shape may be located one by one (e.g., one in each region) about the central through hole 102 surrounding the vacuum suction pipe 134 in regions each obtained by dividing the upper surface of the base 111 into six equal sections in the arc-direction.

These inner air portions 213-12, 213-13, 213-14, 213-15, 213-16, and 213-17 in the sixth shape may have the same shape and area and be equally located in the regions obtained by dividing the upper surface of the base 111 into six equal sections along the arc of the upper surface. Each of the inner air portions 213-12, 213-13, 213-14, 213-15, 213-16, and 213-17 in the sixth shape may have a separate air injection pipe penetrating the base 111 and the support portion 101 and be connected to the external air pump 150.

Accordingly, air is selectively injected into each of the inner air portions 213-12, 213-13, 213-14, 213-15, 213-16, and 213-17 in the sixth shape through the separately connected air injection pipe, so that the wafer chuck 120 can be more stably tilted to either the left or right at a predetermined angle θ.

For example, when the wafer chuck 120 is tilted to the left, a different amount of air is injected into each of three inner air portions 213-12, 213-13, and 213-14 located on the right side among the inner air portions 213-12, 213-13, 213-14, 213-15, 213-16, and 213-17 in the sixth shape, so that the wafer chuck 120 may be tilted at the predetermined angle θ. For example, the amount of air to be injected into the inner air portion 213-13 positioned in the middle among the three inner air portions 213-12, 213-13, and 213-14 located on the right side is set to be different from the amount of air to be injected into the other two adjacent inner air portions 213-12 and 213-14. The amount of air to be injected into the other two adjacent inner air portions 213-12 and 213-14 may be set to be 60% to 80% of the amount of air to be injected into the inner air portion 213-13 positioned in the middle.

Therefore, the three inner air portions 213-12, 213-13, and 213-14 located on the right side stably inflate to lift the wafer chuck 120, so that the wafer chuck 120 can be stably tilted only to the left without being tilted in an unintended direction.

On the other hand, when the wafer chuck 120 is tilted to the right, a different amount of air is injected into each of three inner air portions 213-15, 213-16, and 213-17 located on the left side among the inner air portions 213-12, 213-13, 213-14, 213-15, 213-16, and 213-17 in the sixth shape, so that the wafer chuck 120 may be tilted at the predetermined angle θ. For example, the amount of air to be injected into the inner air portion 213-16 positioned in the middle among the three inner air portions 213-15, 213-16, and 213-17 located on the left side is set to be different from the amount of air to be injected into the other two adjacent inner air portions 213-15 and 213-17. The amount of air to be injected into the other two adjacent inner air portions 213-15 and 213-17 may be set to be 60% to 80% of the amount of air to be injected into the inner air portion 213-16 positioned in the middle.

Therefore, the three inner air portions 213-15, 213-16, and 213-17 located on the left side stably inflate to lift the wafer chuck 120, so that the wafer chuck 120 can be stably tilted only to the right without being tilted in an unintended direction.

Figure 12:
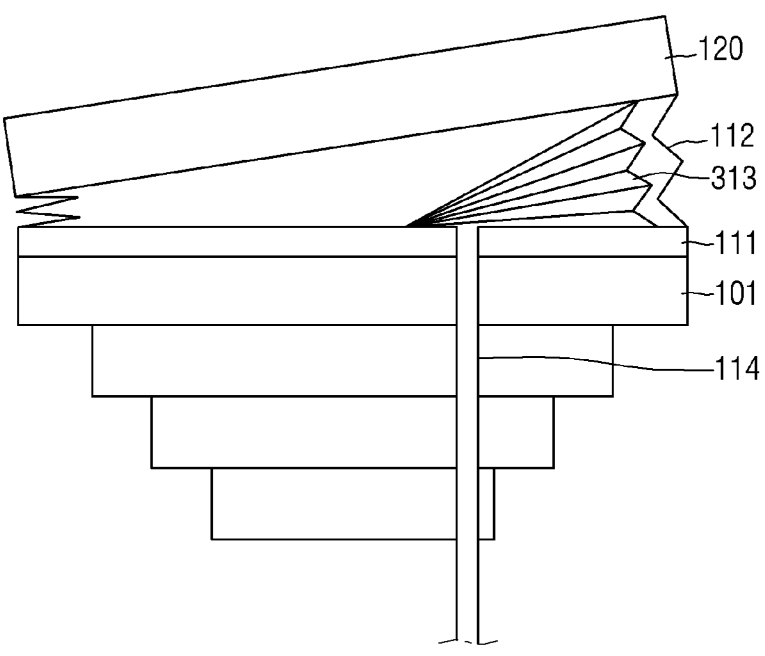
FIG. 12 is a cross-sectional view of a wafer chuck apparatus according to a third embodiment of the present disclosure.

Hereinafter, a wafer chuck apparatus according to a third embodiment of the present disclosure will be described with reference to FIGS. 12 to 18. FIG. 12 is a cross-sectional view of a wafer chuck apparatus according to a third embodiment of the present disclosure, and FIGS. 13 to 18 are views illustrating examples of various shapes of an air member constituting the wafer chuck apparatus according to the third embodiment of the present disclosure.

As shown in FIG. 12, the wafer chuck apparatus according to the third embodiment of the present disclosure is the same as the wafer chuck apparatus according to the first embodiment of the present disclosure described above, and differs from the first embodiment in that an inner air portion 313 is in a fan shape having a plurality of pleats. For example, the wafer chuck apparatus according to the third embodiment of the present disclosure may be the same as the wafer chuck apparatus according to the first embodiment of the present disclosure described above except that an inner air portion 313 is in a fan shape having a plurality of pleats. Accordingly, descriptions of the same configurations as those in the wafer chuck apparatus according to the first embodiment of the present disclosure will not be duplicated/provided here.

The inner air portion 313 constituting the wafer chuck apparatus according to the third embodiment of the present disclosure may be formed in a fan shape having a plurality of pleats using a synthetic resin membrane or fiber made of any one of, for example, a nylon-based resin, a polyester-based resin, a polyolefin-based resin, a Teflon-based resin, and an aramid-based resin. The inner air portion 313 may expand outwards, as air is injected thereto.

For example, as shown in FIG. 12, the inner air portion 313 may have a fan shape in which the distance between the pleats in the outer direction is longer than the distance between the pleats in the center direction of an upper surface of a base 111. External air may be injected into the inner air portion 313 through an air injection pipe 114 penetrating the base 111 and a support portion 101.

As the external air is injected into the inner air portion 313 through the air injection pipe 114, the pleats distant from each other in the outer direction expand to lift the wafer chuck 120, so that the wafer chuck 120 can be tilted at a predetermined angle θ with respect to the upper surface of the base 111.

The inner air portion 313 according to the third embodiment of the present disclosure may be provided at various positions as shown in FIGS. 13 to 18.

Figure 13:
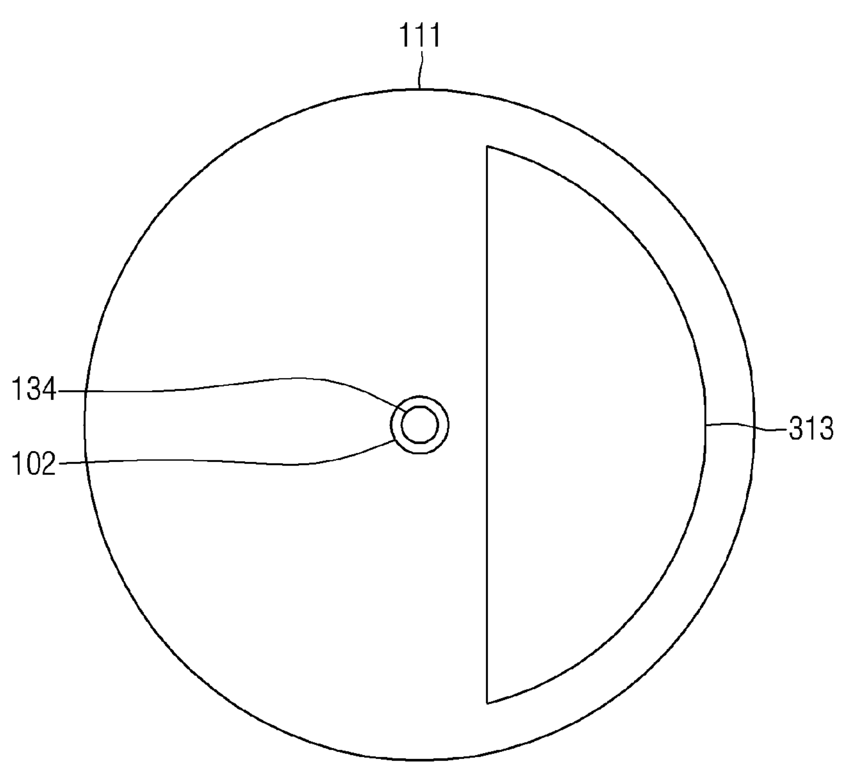
FIGS. 13 to 18 are views of examples illustrating various shapes of an air member constituting the wafer chuck apparatus according to the third embodiment of the present disclosure.

For example, as shown in FIG. 13, the inner air portion 313 in a first shape may be located in a right half of the upper surface of the base 111 bisected into left and right halves around (e.g., with respect to) a central through hole 102 surrounding a suction pipe 134.

The inner air portion 313 in the first shape has a fan shape having a flat angle and is located on the right side with respect to the central through hole 102. The inner air portion 313 is connected to an external air pump 150 through the air injection pipe 114 penetrating the base 111 and the support portion 101.

Accordingly, air is injected into the inner air portion 313 in the first shape through the air injection pipe 114 and the pleats in the outer direction of the inner air portion 313 expand to lift a right side of the wafer chuck 120 from the upper surface of the base 111, so that the wafer chuck 120 may be tilted at a predetermined angle θ as shown in FIG. 12.

Figure 14:
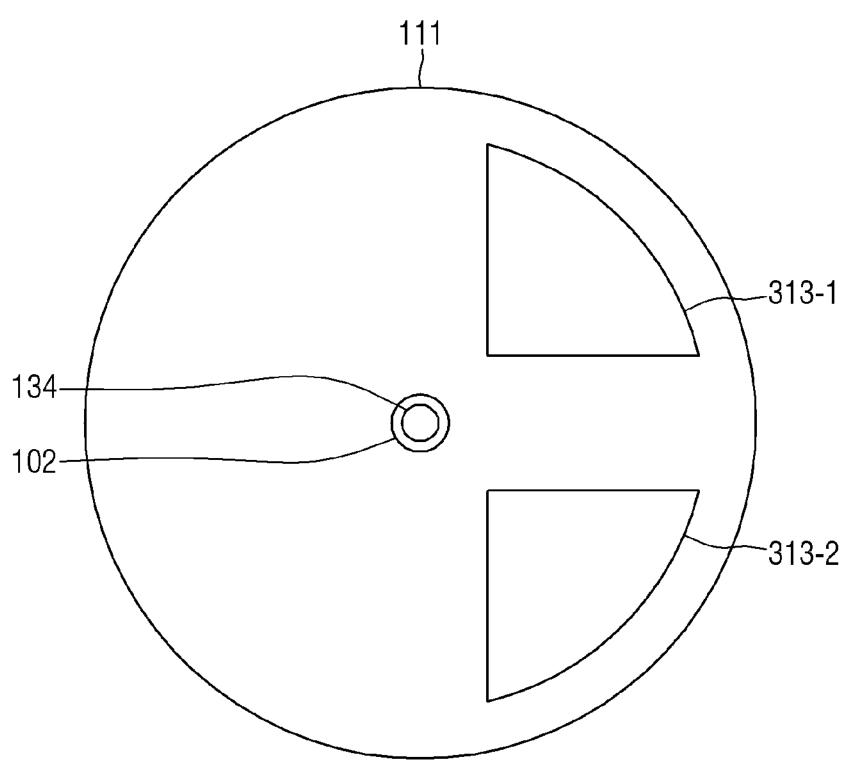

Alternatively, as shown in FIG. 14, two inner air portions 313-1 and 313-2 in a second shape may be located in a right half of the upper surface of the base 111 bisected into left and right halves around (e.g., with respect to) the central through hole 102 surrounding the suction pipe 134.

These two inner air portions 313-1 and 313-2 in the second shape may have the same fan shape with an interior angle of 90 degrees and the same area and may be equally located in the right side. Each of the inner air portions 313-1 and 313-2 in the second shape may have a separate air injection pipe penetrating the base 111 and the support portion 101 and be connected to the external air pump 150.

Accordingly, air is equally injected into each of the two inner air portions 313-1 and 313-2 in the second shape through the separately connected air injection pipe, so that the wafer chuck 120 may tilt more stably to the right at a predetermined angle θ.

Figure 15:
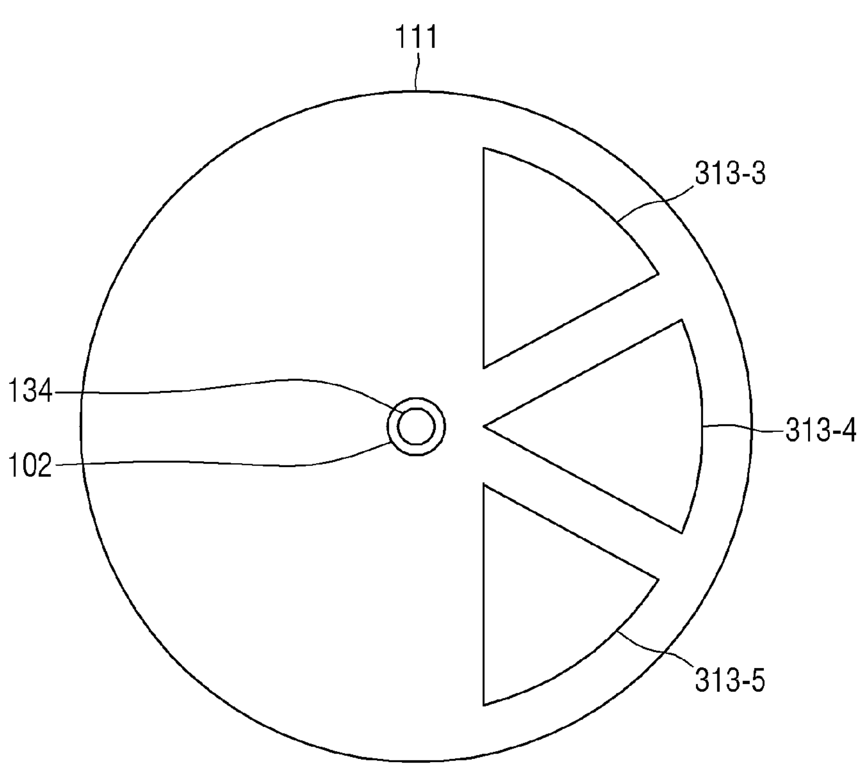

Alternatively, as shown in FIG. 15, three inner air portions 313-3, 313-4, and 313-5 in a third shape may be located at the right side on the upper surface of the base 111 divided into six equal sections around the central through hole 102 surrounding the suction pipe 134.

These three inner air portions 313-3, 313-4, and 313-5 in the third shape may have the same fan shape with an interior angle of 30 degrees and the same area and may be equally located in the right side. Each of the inner air portions 313-3, 313-4, and 313-5 in the third shape may have a separate air injection pipe penetrating the base 111 and the support portion 101 and be connected to the external air pump 150.

Accordingly, a different amount of air may be injected into each of the three inner air portions 313-3, 313-4, and 313-5 in the third shape through the separately connected air injection pipe, so that the wafer chuck 120 may be more stably tilted at a predetermined angle θ.

For example, the amount of air to be injected into the inner air portion 313-4 positioned in the middle among the three inner air portions 313-3, 313-4, and 313-5 in the third shape is set to be different from the amount of air to be injected into the other two adjacent inner air portions 313-3 and 313-5. The amount of air to be injected into the other two adjacent inner air portions 313-3 and 313-5 may be set to be 60% to 80% of the amount of air to be injected into the inner air portion 313-4 positioned in the middle.

Therefore, the three inner air portions 313-3, 313-4, and 313-5 in the third shape stably expand to lift the wafer chuck 120, so that the wafer chuck 120 can be stably tilted without being tilted in an unintended direction.

Figure 16:
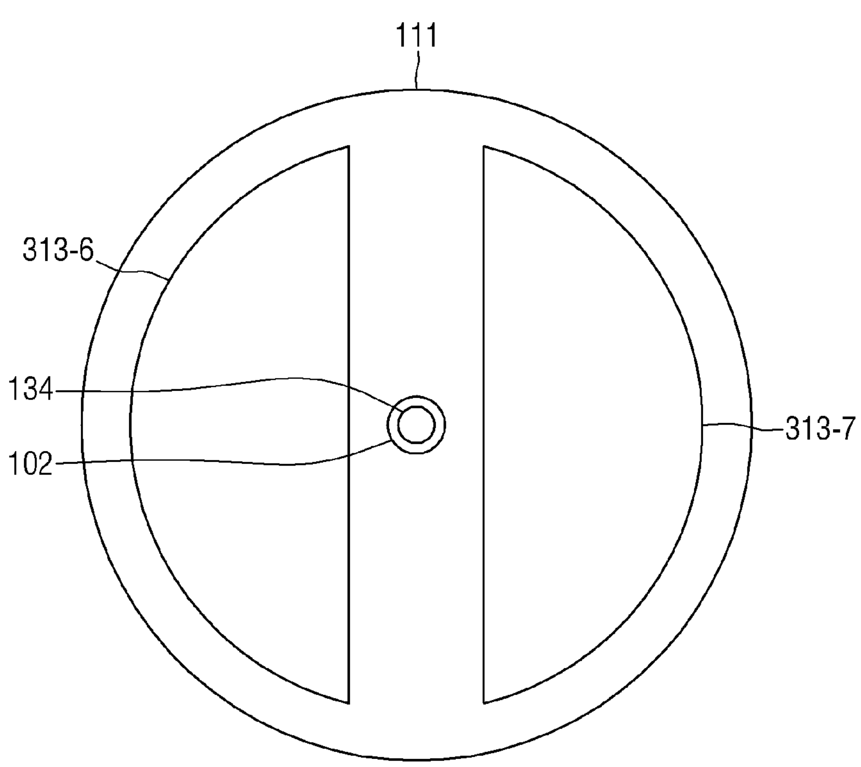

Alternatively, as shown in FIG. 16, two inner air portions 313-6 and 313-7 in a fourth shape may be located one by one about (e.g., on opposite sides with respect to) the central through hole 102 surrounding the suction pipe 134 in regions obtained by bisecting the upper surface of the base 111 into left and right halves.

The two inner air portions 313-6 and 313-7 in the fourth shape may have the same fan shape with a flat angle and the same area and may be equally/symmetrically located in the left and right halves of the base 111. Each of the inner air portions 313-6 and 313-7 in the fourth shape may have a separate air injection pipe penetrating the base 111 and the support portion 101 and be connected to the external air pump 150.

Accordingly, air may be selectively injected into each of the inner air portions 313-6 and 313-7 in the fourth shape through the separately connected air injection pipe, so that the wafer chuck 120 can be tilted at a predetermined angle θ in either the left or right direction as selected.

Figure 17:
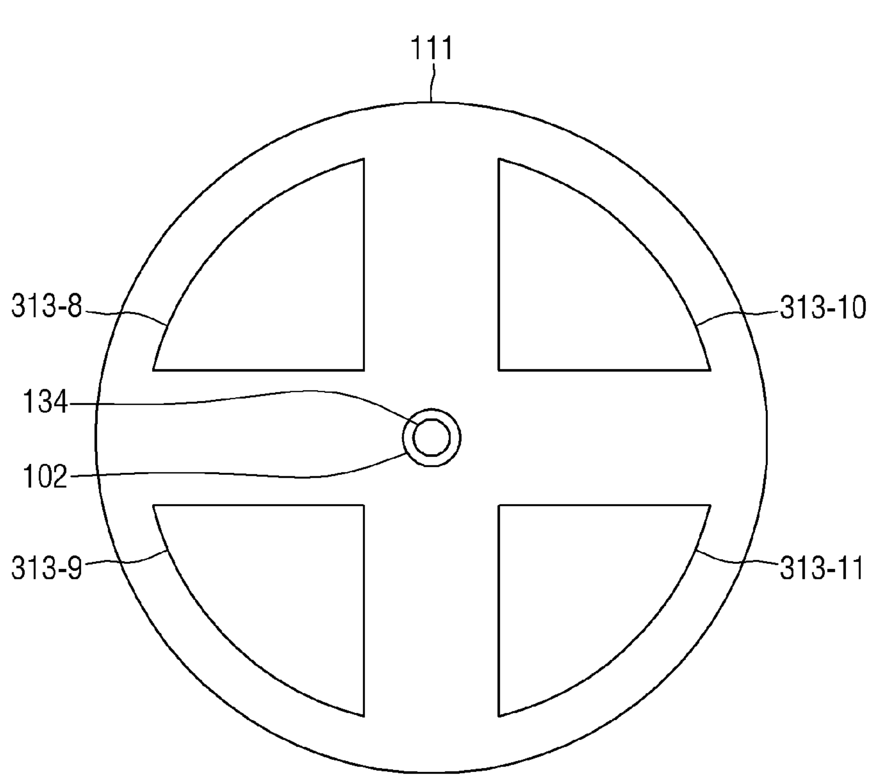

Alternatively, as shown in FIG. 17, inner air portions 313-8, 313-9, 313-10, and 313-11 in a fifth shape may be located one by one (e.g., one in each region) about the central through hole 102 surrounding the suction pipe 134 in regions each obtained by dividing the upper surface of the base 111 into quarters.

These inner air portions 313-8, 313-9, 313-10, and 313-11 in a fifth shape may have the same fan shape with an interior angle of 90 degrees and the same area and be equally located in the quartered regions along the arc of the upper surface of the base 111. Each of the inner air portions 313-8, 313-9, 313-10, and 313-11 in the fifth shape may have a separate air injection pipe penetrating the base 111 and the support portion 101 and be connected to the external air pump 150.

Accordingly, air is selectively injected into each of the inner air portions 313-8, 313-9, 313-10, and 313-11 in the fifth shape through the separately connected air injection pipe, so that the wafer chuck 120 can be more stably tilted to either the left or right at a predetermined angle θ.

For example, when the wafer chuck 120 is tilted to the left, air is equally injected into two inner air portions 313-10 and 313-11 located on the right side among the inner air portions 313-8, 313-9, 313-10, and 313-11 in the fifth shape, so that the wafer chuck 120 may be tilted at the predetermined angle θ.

On the other hand, when the wafer chuck 120 is tilted to the right, air is equally injected into two inner air portions 313-8 and 313-9 located on the left side among the inner air portions 313-8, 313-9, 313-10, and 313-11 in the fifth shape, so that the wafer chuck 120 may be tilted at the predetermined angle θ.

Figure 18:
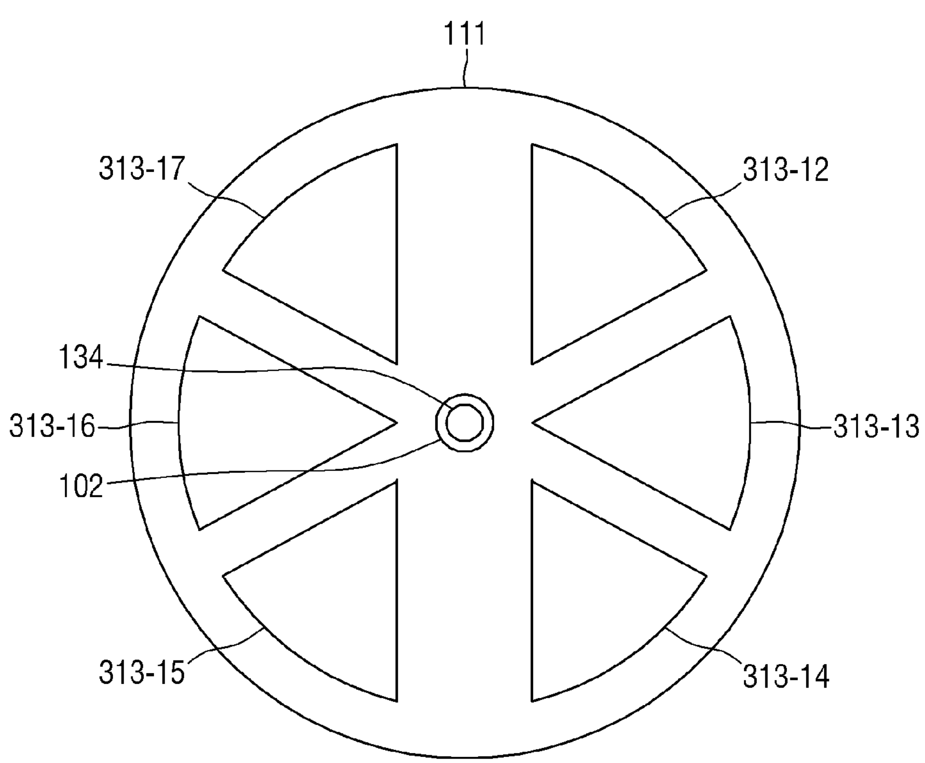

Alternatively, as shown in FIG. 18, inner air portions 313-12, 313-13, 313-14, 313-15, 313-16, and 313-17 in a sixth shape may be located one by one (e.g., one in each region) about the central through hole 102 surrounding the suction pipe 134 in regions each obtained by dividing the upper surface of the base 111 into six equal sections along the arc-direction.

These inner air portions 313-12, 313-13, 313-14, 313-15, 313-16, and 313-17 in the sixth shape may have the same fan shape with an interior angle of 60 degrees and the same area and be equally located in the six equally divided regions along the arc of the upper surface of the base 111. Each of the inner air portions 313-12, 313-13, 313-14, 313-15,

313-16, and 313-17 in the sixth shape may have a separate air injection pipe penetrating the base 111 and the support portion 101 and be connected to the external air pump 150.

Accordingly, air is selectively injected into each of the inner air portions 313-12, 313-13, 313-14, 313-15, 313-16, and 313-17 in the sixth shape through the separately connected air injection pipe, so that the wafer chuck 120 can be more stably tilted to either the left or right at a predetermined angle θ.

For example, when the wafer chuck 120 is tilted to the left, a different amount of air is injected into each of three inner air portions 313-12, 313-13, and 313-14 located on the right side among the inner air portions 313-12, 313-13, 313-14, 313-15, 313-16, and 313-17 in the sixth shape, so that the wafer chuck 120 may be tilted at the predetermined angle θ. For example, the amount of air to be injected into the inner air portion 313-13 positioned in the middle among the three inner air portions 313-12, 313-13, and 313-14 located on the right side is set to be different from the amount of air to be injected into the other two adjacent inner air portions 313-12 and 313-14. The amount of air to be injected into the other two adjacent inner air portions 313-12 and 313-14 may be set to be 60% to 80% of the amount of air to be injected into the inner air portion 313-13 positioned in the middle.

Therefore, the three inner air portions 313-12, 313-13, and 313-14 located on the right side stably expand to lift the wafer chuck 120, so that the wafer chuck 120 can be stably tilted only to the left without being tilted in an unintended direction.

On the other hand, when the wafer chuck 120 is tilted to the right, a different amount of air is injected into each of three inner air portions 313-15, 313-16, and 313-17 located on the left side among the inner air portions 313-12, 313-13, 313-14, 313-15, 313-16, and 313-17 in the sixth shape, so that the wafer chuck 120 may be tilted at the predetermined angle θ. For example, the amount of air to be injected into the inner air portion 313-16 positioned in the middle among the three inner air portions 313-15, 313-16, and 313-17 located on the left side is set to be different from the amount of air to be injected into the other two adjacent inner air portions 313-15 and 313-17. The amount of air to be injected into the other two adjacent inner air portions 313-15 and 313-17 may be set to be 60% to 80% of the amount of air to be injected into the inner air portion 313-16 positioned in the middle.

Therefore, the three inner air portions 313-15, 313-16, and 313-17 located on the left side stably expand to lift the wafer chuck 120, so that the wafer chuck 120 can be stably tilted only to the right without being tilted in an unintended direction.

Figure 19:
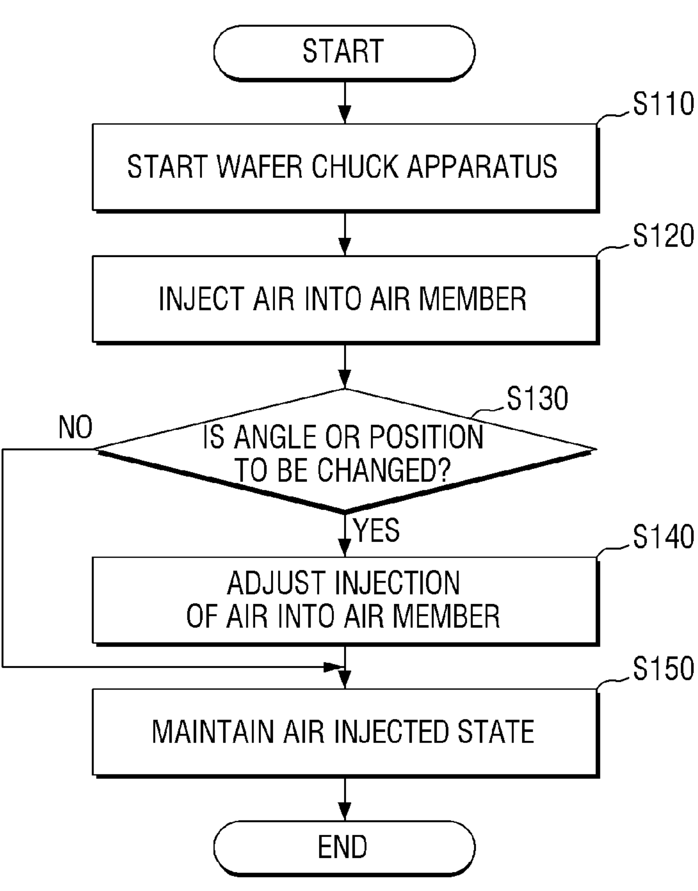
FIG. 19 is a flowchart of a method of fabricating a semiconductor device using a wafer chuck apparatus according to a fourth embodiment of the present disclosure.
Figure 20:
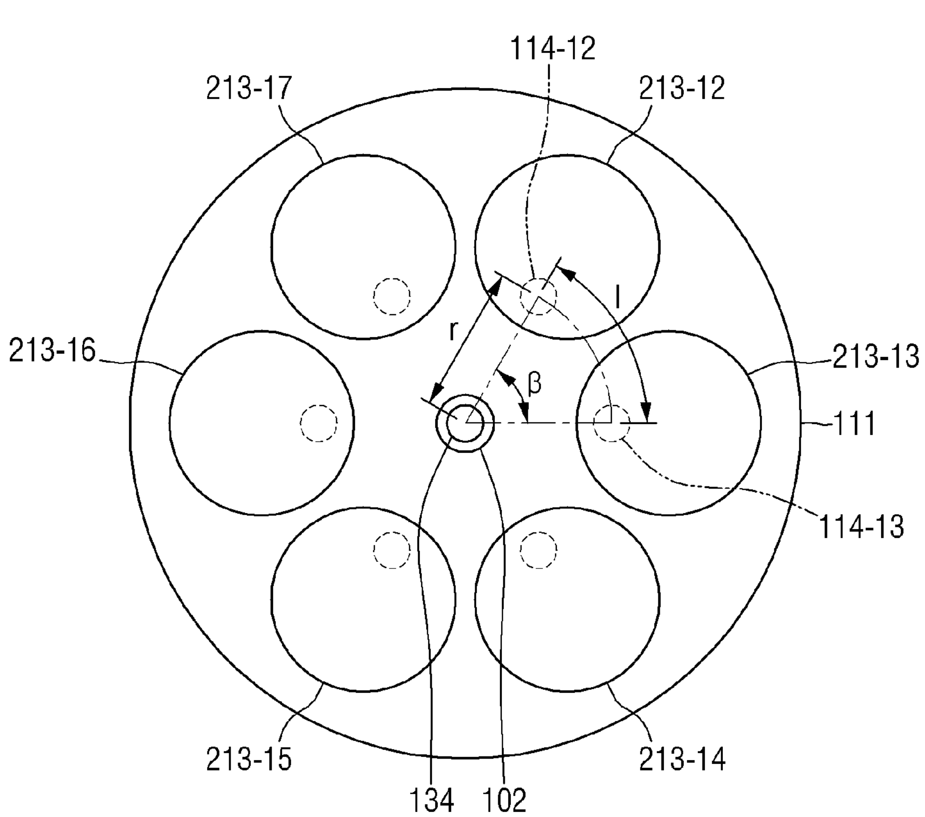
FIGS. 20 to 22 are views for describing the method of fabricating a semiconductor device using a wafer chuck apparatus according to the fourth embodiment of the present disclosure.

Hereinafter, a method of fabricating a semiconductor device using a wafer chuck apparatus according to a fourth embodiment of the present disclosure will be described with reference to FIGS. 19 to 22. FIG. 19 is a flowchart of a method of fabricating a semiconductor device using a wafer chuck apparatus according to a fourth embodiment of the present disclosure, and FIGS. 20 to 22 are views for describing the method of fabricating a semiconductor device using a wafer chuck apparatus according to the fourth embodiment of the present disclosure.

Figure 21:
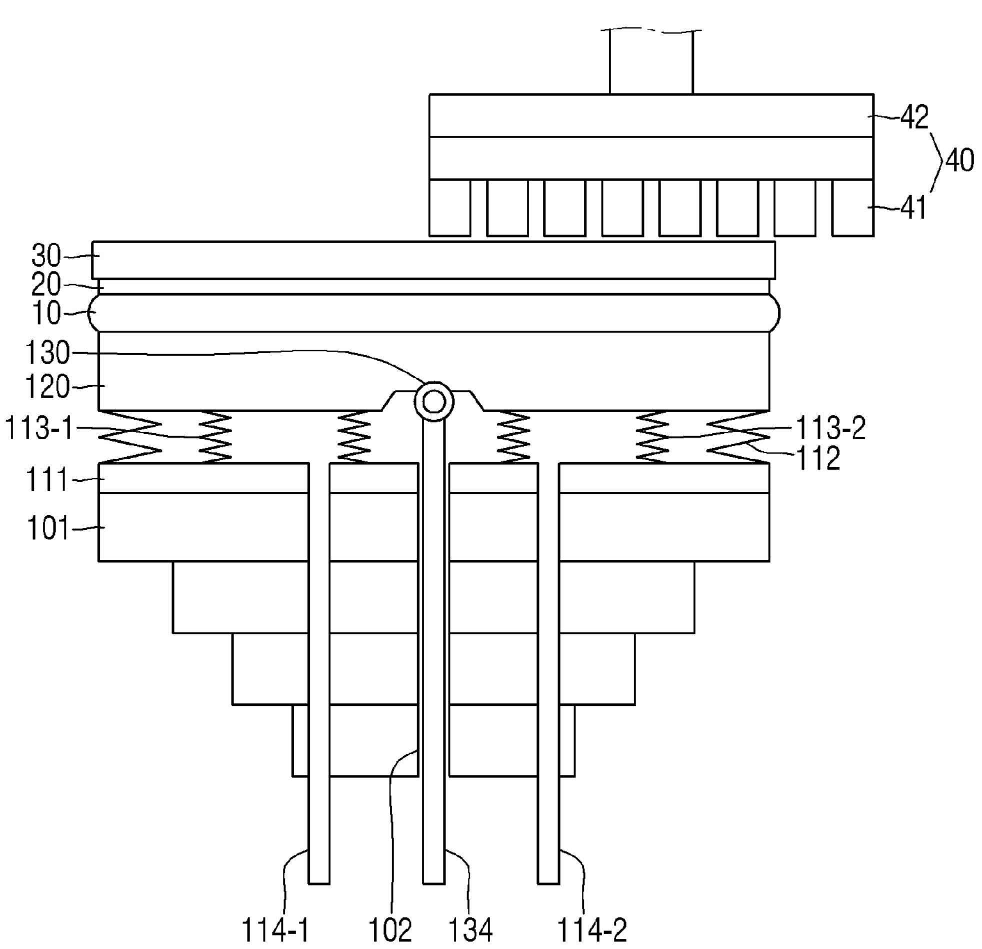
Figure 22:
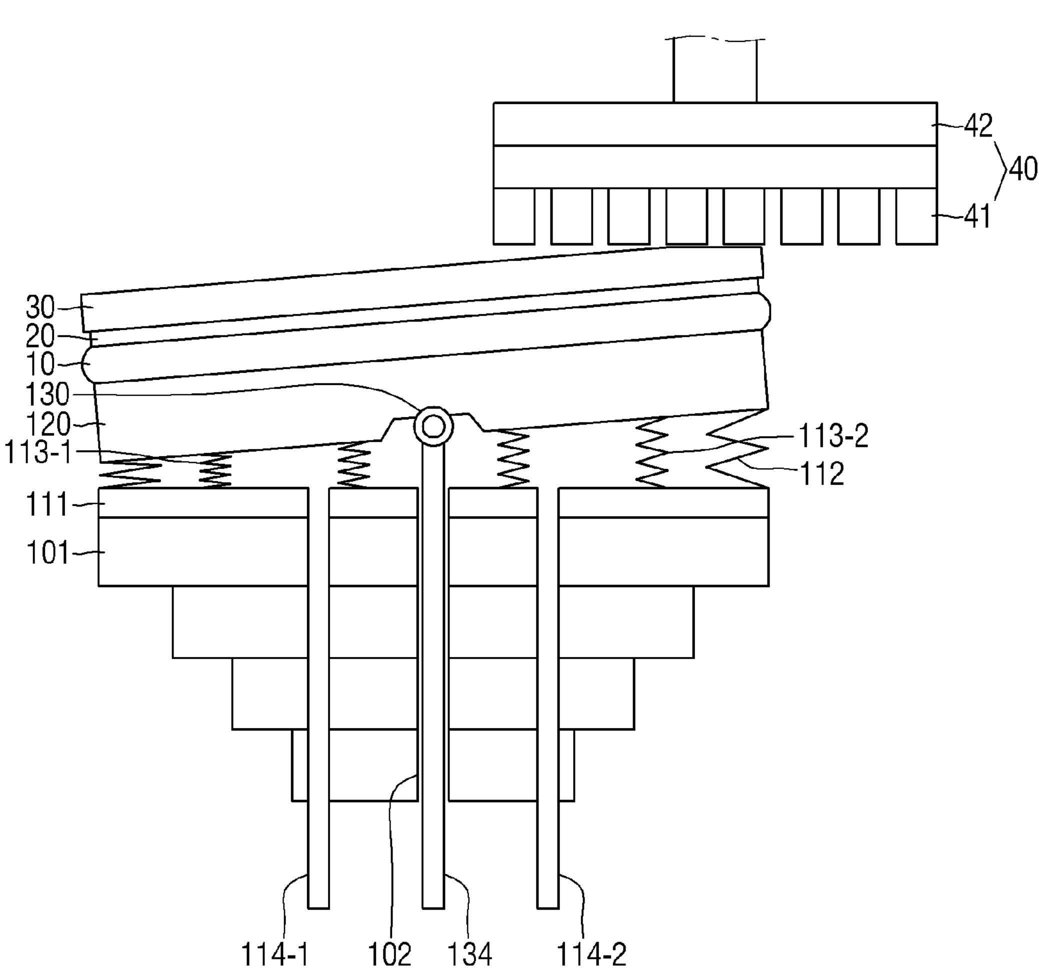

In the method of fabricating a semiconductor device using a wafer chuck apparatus according to a fourth embodiment of the present invention, first, as shown in FIG. 21, a carrier substrate 10 to which a wafer 30 to be processed is attached is provided on an upper surface of a wafer chuck 120 and a wafer chuck apparatus is started (S110).

Here, the wafer chuck apparatus is similar to or the same as the wafer chuck apparatus according to the first embodiment of the present disclosure. For example, as shown in FIG. 21, the wafer chuck apparatus includes a support portion 101 made of a metallic material (e.g., a metal) and having a disk-shape having a circular upper surface, a disk-shaped wafer chuck 120 positioned on the support portion 101 and having a plurality of vacuum channels therein, an air member connecting/disposed between the support portion 101 and the wafer chuck 120 and connected to an external air pump, a hinge connection 130 connected to the plurality of vacuum channels at the center of a lower portion of the wafer chuck 120 and connected to an external vacuum pump through a vacuum suction pipe 134, and a controller (not shown) connected to the vacuum pump, the air pump, the vacuum suction pipe 134, and the like and configured to control the same.

The air member includes a base 111 provided on the upper surface of the support portion 101, an outer air portion 112 configured to connect the edge of the base 111 and the edge of the wafer chuck 120, and two inner air portions 113-1 and 113-2 located about a central through hole 102 surrounding the suction pipe 134 in each region obtained by bisecting the upper surface of the base 111 and configured to connect one upper side of the base 111 to one side of a lower surface of the wafer chuck 120. For example, the outer air portion (e.g., the outer air holder/bag) 112 may extend from the base 111 to the wafer chuck 120. For example, the two inner air portions (e.g., two inner air bags/holders) 113-1 and 113-2 may extend from an upper surface of the base 111 to a lower surface of the wafer chuck 120. The outer air portion may be an outer portion of the air member (e.g., a pneumatic device) 110 and the inner air portions may be inner portions of the air member 110.

The two inner air portions 113-1 and 113-2 may each be provided in the form of a circular pleated tube having a plurality of pleats and are connected to the external air pump through air injection pipes 114-1 and 114-2, respectively, provided in the inner air portions 113-1 and 113-2 and each passing through the base 111 and the support portion 101.

In this case, the wafer 30 to be processed is attached to the carrier substrate 10 using an adhesive layer 20, and the carrier substrate 10 to which the wafer 30 is attached is held by vacuum through vacuum holes of the upper surface connected to each of the plurality of vacuum channels 121 in the wafer chuck 120.

In this state, in order to obtain a uniform thickness by reducing a thickness deviation of the wafer 30 to be processed, the controller performs a grinding process on an upper surface of the wafer 30 using a grinding wheel 40 having a plurality of grits 41 (i.e., grains) on a lower surface of the housing 42, as shown in FIG. 21.

Thereafter, the controller starts the wafer chuck apparatus in order to perform a grinding process on an edge region of the wafer 30 according to a user's control command information. For example, the starting the wafer chuck apparatus may be an operation holding/fixing a substrate/wafer on the wafer chuck. The controller selectively controls each of the air injection pipes 114-1 and 114-2 connected to the external air pump to inject air into one of the two inner air portions 113-1 and 113-2, thereby tilting the wafer 30 at a predetermined angle θ.

For example, as shown in FIG. 22, in order to tilt the wafer 30 to the left, the controller inject air into the right inner air portion 113-2 through the right air injection pipe 114-2 among the air injection pipes 114-1 and 114-2 connected to the external air pump. Here, the controller may inject a predetermined amount of air into the right inner air portion 113-2 in proportion to the predetermined angle at which the wafer 30 is to be tilted, and may raise the suction pipe 134 to a predetermined height.

In this case, when the inner air portion is configured as inner portions 213-12, 213-13, 213-14, 213-15, 213-16, and 213-17 in a sixth shape as shown in FIG. 20, the controller may inject a different amount of air into each of three inner air portions 213-12, 213-13, and 213-14 located on the right side in order to tilt the wafer 30 to the left, so that the wafer chuck 120 may be tilted at a predetermined angle θ, e.g., to the left.

For example, the amount of air to be injected into the inner air portion 213-13 positioned in the middle among the three inner air portions 213-12, 213-13, and 213-14 located on the right side may be set to be different from the amount of air to be injected into the other two adjacent inner air portions 213-12 and 213-14.

For example, in the differential setting, a length l of an arc from the air injection pipe 114-13 connected to the inner air portion 213-13 positioned in the middle to the air injection pipe 114-12 connected to the adjacent inner air portion 213-12 may be calculated by Equation 1 below using a radius r from the center of the suction pipe 134 to the air injection pipe and an angle β between the two inner portions 213-12 and 213-13.

$$l = r \times \beta \quad \text{[Equation 1]}$$

The amount of air P1 to be injected into the adjacent inner air portion 213-12 may be set based on the amount of air P0 to be injected into the inner air portion 213-13 positioned in the middle through equation 2 below using the length l of the arc, an area ratio ST of the adjacent inner air portion 213-12 to the inner air portion 213-13 positioned in the middle, and a tilt angle θ of the wafer chuck 120.

$$P_1 = \frac{s_T \times \theta}{\ell} P_0$$

By the differential setting, a different amount of air may be injected into the two adjacent inner air portions 213-12 and 213-14 based on the inner air portion 213-13 positioned in the middle, so that the wafer chuck 120 can be stably tilted at a predetermined angle θ.

The controller may perform a grinding process on the edge region of the wafer 30 while the wafer chuck 120 is tilted at the predetermined angle θ.

Thereafter, the controller determines whether to change the tilt angle θ of the wafer chuck 120 or the position of the wafer 30 to be subjected to a grinding process according to the user's command information.

For example, upon receiving the user's command information for changing the tilt angle θ of the wafer chuck 120 or performing a grinding process on a central part of the wafer 30, the controller may determine the numerical value of the tilt angle θ of the wafer chuck 120 to be changed and the amount of air to be injected into each of the inner air portions 213-12, 213-13, 213-14, 213-15, 213-16, and 213-17 according to the position change of the wafer 30 by using Equation 2.

Accordingly, the controller adjust the amount of air to be injected into each of the inner air portions 213-12, 213-13, 213-14, 213-15, 213-16, and 213-17 according to the changed tilt angle θ of the wafer chuck 120 or the position change of the wafer 30 to be subjected to a grinding process (S140).

For example, the controller may adjust the amount of air P0 to be injected into the inner air portion 213-13 positioned in the middle and the amount of air P1 to be injected into the adjacent inner air portion to change the tilt angle θ of the wafer chuck 120 or the amount of air to be injected into each of the inner air portions 213-12, 213-13, 213-14, 213-15, 213-16, and 213-17, so that the wafer chuck 120 is positioned at a straight angle and a grinding process may be performed on the central part of the wafer 30.

The controller maintains the inner air portions in the air injected state until the grinding process on the wafer 30 is finished (S150).

For example, the controller may detect the pressure of the air injected into each of the inner air portions 213-12, 213-13, 213-14, 213-15, 213-16, and 213-17 through a pressure sensor, to check the amount of air injected into each of the inner air portions 213-12, 213-13, 213-14, 213-15, 213-16, and 213-17. The controller may adjust the amount of air injected into the inner air portions according to insufficient or excessive air pressure, and maintain the inner air portions in the air injected state until the grinding process on the wafer 30 is finished.

Accordingly, the method of fabricating a semiconductor device using a wafer chuck apparatus according to the fourth embodiment of the present disclosure may minutely change the tilt angle θ of the wafer 30 by adjusting the amount of air injected into the inner air portions and may easily perform a semiconductor process, such as a grinding process on the wafer 30.

Even though different figures show variations of exemplary embodiments and different embodiments disclose different features from each other, these figures and embodiments are not necessarily intended to be mutually exclusive from each other. Rather, certain features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be combined with components and/or features of other embodiments interchangeably or additionally unless the context indicates otherwise.

While the present disclosure has been particularly shown and described with reference to embodiments thereof and using specific terms, these embodiments are provided so that this disclosure will fully convey the concept of the present disclosure, and not for purposes of limitation.

Thus, it will be obvious to one of ordinary skill in the art that various changes and other equivalents may be made therein. Therefore, the scope of the present disclosure is defined not by the detailed description of the present disclosure but by the appended claims.

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed:

1. A wafer chuck apparatus comprising:

a rotatable support portion made of a metal material and having a circular upper surface;

a wafer chuck having a disk shape positioned on the rotatable support portion and having a plurality of vacuum channels therein;

an air member disposed between the rotatable support portion and the wafer chuck and connected to an external pump, the air member configured to extend in response to receiving a fluid from the external pump; and a hinge rotatably connecting the wafer chuck and the rotatable support portion to one another and connected to the plurality of vacuum channels at a center of a lower portion of the wafer chuck and connected to a vacuum pump through a vacuum suction pipe.

2. The wafer chuck apparatus of claim 1, wherein the air member comprises:

a base provided on the circular upper surface of the rotatable support portion;

an outer air holder connecting an edge of the base with an edge of the wafer chuck; and an inner air holder disposed around a central through hole surrounding the vacuum suction pipe on an upper surface of the base in a circumferential direction and connecting the upper surface of the base with a lower surface of the wafer chuck.

3. The wafer chuck apparatus of claim 2, wherein the outer air holder is provided in a shape of a circular pleated tube having a plurality of pleats, which connects the edge of the base with the edge of the wafer chuck.

4. The wafer chuck apparatus of claim 2, wherein the outer air holder and the inner air holder are formed of a membrane or fiber made of a synthetic resin material.

5. The wafer chuck apparatus of claim 2, wherein a plurality of inner air holders are provided around the central through hole in the circumferential direction and each of the plurality of inner air holders has any one shape of a circular pleated tube having a plurality of pleats, a hemisphere balloon shape, and a fan shape having a plurality of pleats.

6. The wafer chuck apparatus of claim 2, wherein a plurality of inner air holders are divided into left and right inner air holders around the central through hole and configured to tilt the wafer chuck to a predetermined angle based on the left inner air holder receiving a first amount of air and the right inner air holder receiving a second amount of air different than the first amount.

7. The wafer chuck apparatus of claim 6, wherein the air pump is configured to inject a different amount of air into each of the plurality of inner air holders according to a length l of an arc from an air injection pipe connected to an inner air holder positioned in the middle among the plurality of inner air holders to an air injection pipe connected to an adjacent inner air holder, an area ratio ST of the adjacent inner air holder to the inner air holder positioned in the middle, and a tilt angle θ of the wafer chuck.

8. The wafer chuck apparatus of claim 2, wherein a plurality of inner air holders are disposed around a central through hole surrounding the vacuum suction pipe on the upper surface of the base at equal intervals in a circumferential direction.

9. The wafer chuck apparatus of claim 1, wherein the hinge comprises:

a rotating portion which is in a cylindrical shape having a hole in a lengthwise direction, is partially inserted into the center of the lower portion of the wafer chuck, and is connected to the vacuum suction pipe at a lower portion; and a first vacuum channel pipe and a second vacuum channel pipe connected to opposite ends of the rotating portion and connected to the plurality of vacuum channels.

10. A wafer chuck apparatus comprising:

a rotatable support portion made of a metal material and having a circular upper surface;

a wafer chuck having a disk shape, positioned on the rotatable support portion, and having a plurality of vacuum channels therein;

an air member disposed between the rotatable support portion and the wafer chuck and connected to an external air pump; and a hinge rotatably connecting the rotatable support portion to the wafer chuck and connected to the plurality of vacuum channels at a center of a lower portion of the wafer chuck and connected to an external vacuum pump through a vacuum suction pipe, wherein the air member comprises:

a base provided on the circular upper surface of the rotatable support portion;

an outer air holder connecting an edge of the base with an edge of the wafer chuck; and an inner air holder disposed around a central through hole surrounding the vacuum suction pipe on an upper surface of the base in a circumferential direction and connecting an upper surface of the base with a lower surface of the wafer chuck, the outer air holder is provided in a shape of a circular pleated tube having a plurality of pleats, which connects the edge of the base with the edge of the wafer chuck, and the inner air holder is provided in a shape of a circular pleated tube having a plurality of pleats.

11. The wafer chuck apparatus of claim 10, further comprising:

a controller connected to the external vacuum pump, the external air pump, and the vacuum suction pipe, and configured to control the same, wherein the controller is configured to divide a plurality of inner air holders into left and right inner air holders around the central through hole and inject a different amount of air into each of a plurality of inner air holders positioned in an opposite direction to a tilting direction to tilt the wafer chuck to a predetermined angle.

12. The wafer chuck apparatus of claim 11, wherein the controller is configured to inject a different amount of air into each of the plurality of inner air holders according to a length l of an arc from an air injection pipe connected to an inner air holder positioned in the middle among the plurality of inner air holders to an air injection pipe connected to an adjacent inner air holder, an area ratio ST of the adjacent inner air holder to the inner air holder positioned in the middle, and a tilt angle θ of the wafer chuck.

* * * * *